US012796156B2

(12) United States Patent
Sridhara et al.

(10) Patent No.: US 12,796,156 B2
(45) Date of Patent: Nov. 10, 2026

(54) SOLAR CELL ASSEMBLY

(71) Applicant: REC Solar PTE. Ltd., Singapore (SG)

(72) Inventors: Shankar Gauri Sridhara, Singapore (SG); Bjorn Andersson, Singapore (SG); Jeonghun Yu, Singapore (SG)

(73) Assignee: REC Solar PTE. Ltd., Singapore (SG)

( * ) Notice: Subject to any disclaimer, the term of this patent is extended or adjusted under 35 U.S.C. 154(b) by 0 days.

(21) Appl. No.: 18/725,081

(22) PCT Filed: Dec. 9, 2022

(86) PCT No.: PCT/EP2022/085154
§ 371 (c)(1),
(2) Date: Jun. 27, 2024

(87) PCT Pub. No.: WO2023/126150
PCT Pub. Date: Jul. 6, 2023

(65) Prior Publication Data

US 2025/0072160 A1 Feb. 27, 2025

(30) Foreign Application Priority Data

Dec. 29, 2021 (GB) ..................................... 2119064

(51) Int. Cl.
*H10F 77/20* (2025.01)

(52) U.S. Cl.
CPC .................................. *H10F 77/215* (2025.01)

(58) Field of Classification Search
CPC ...... H10F 77/215; H10F 10/16; H10F 19/904; H10F 77/211
See application file for complete search history.

(56) References Cited

U.S. PATENT DOCUMENTS

2004/0244828 A1* 12/2004 Nishikawa ............ H10F 19/906 136/258
2015/0372177 A1 12/2015 Kim et al.
(Continued)

FOREIGN PATENT DOCUMENTS

DE 10239845 C1 12/2003
EP 3633739 A1 4/2020
(Continued)

OTHER PUBLICATIONS

GB Search Report for GB Application No. GB2119064.0, mailed on May 27, 2022, 3 pages.
(Continued)

*Primary Examiner* — Michael Y Sun
(74) *Attorney, Agent, or Firm* — Lee & Hayes, P.C.

(57) ABSTRACT

A solar cell assembly (100) comprising: a layered structure (102) comprising a photovoltaic element and a conductive surface (111); and an electrode assembly (101) comprising a plurality of longitudinally extending, laterally spaced conductive elements (104*a*-104*f*) arranged side by side, the plurality of conductive elements comprising a first conductive element (104*b*) having a first cross-sectional area and a second conductive element (104*a*) having a second cross-sectional area that is larger than the first cross-sectional area, the electrode assembly arranged on the conductive surface of the layered structure such that the conductive elements are in ohmic contact with the conductive surface.

23 Claims, 2 Drawing Sheets

(56) References Cited

U.S. PATENT DOCUMENTS

| | | | | |
|---|---|---|---|---|
| 2016/0149064 | A1* | 5/2016 | Oh | H10F 19/902 136/244 |
| 2020/0111927 | A1 | 4/2020 | Lee et al. | |

FOREIGN PATENT DOCUMENTS

| | | | | | |
|---|---|---|---|---|---|
| WO | WO2004021455 | A1 | | 3/2004 | |
| WO | WO-2016125882 | A1 | * | 8/2016 | H01L 31/05 |

OTHER PUBLICATIONS

Search Report and Written Opinion for International Application No. PCT/EP2022/085154, mailed on Mar. 31, 2023, 13 pages.
Office Action for Taiwanese Application No. 111147423, Dated Jun. 12, 2026, 9 pages.

* cited by examiner

SOLAR CELL ASSEMBLY

CROSS-REFERENCE TO RELATED APPLICATIONS

This application is a U.S. National Phase Patent Application based on International Patent Application No. PCT/EP2022/085154, filed Dec. 9, 2022; which claims priority to GB Patent Application No. 2119064.0, filed Dec. 29, 2021. The above referenced applications are incorporated herein by reference in their entirety as if fully set forth herein.

FIELD OF THE DISCLOSURE

The present disclosure relates to electrode assemblies for solar cells and to solar cells including electrode assemblies.

BACKGROUND

Solar modules for providing electrical energy from sunlight typically comprise an array of solar cells, each comprising a semiconductor substrate. The solar cells are traditionally connected so that electrical current is routed via a plurality of finger electrodes on front and rear surfaces of each cell to a series of wider, perpendicular busbar electrodes which are printed on the front and rear sides of the cell. From the busbar electrodes, the electrical current flows to a junction box along a series of copper ribbons, each one soldered to a respective busbar electrode.

A general aim for solar cell development is to attain high conversion efficiency balanced by a need for reduced production costs. Efforts to achieve this have focussed on the electrode connections between the solar cells in a solar cell module and the properties of the semiconductor substrate.

For example, one known arrangement comprises a foil wire (electrode) assembly in which the busbars are replaced by a plurality of wires arranged on a film (or foil). Busbars are typically rectangular in cross-section (with the longer dimension parallel to the front surface of the solar cell). The wires of a foil wire electrode assembly, on the other hand, are typically circular in cross-section. For the same cross-sectional area, a circular shape presents less of an obstruction to light than a rectangular shape. Additionally, a circular geometry means that less incident light is reflected directly away from the solar cell. Accordingly, the replacement of busbars with a plurality of wires can provide a reduction in optical losses that arise from light shading that would otherwise be caused by the presence of busbars. While this can result in increased conversion efficiency, there is an ongoing desire to further improve the efficiency of solar cells, and to maintain that improved efficiency over the operating life of those solar cells.

SUMMARY

According to a first aspect there is provided a solar cell assembly comprising:

- a layered structure comprising a photovoltaic element and a conductive surface (e.g. a conductive outer surface); and
- an electrode assembly comprising a plurality of longitudinally extending, laterally spaced conductive elements arranged side by side, the plurality of conductive elements comprising a first conductive element having a first cross-sectional area and a second conductive element having a second cross-sectional area that is larger than the first cross-sectional area, the electrode assembly arranged on the conductive surface of the layered structure such that the conductive elements are in ohmic contact with the conductive surface.

The conductive elements collect current from the layered structure (e.g. via finger electrodes arranged on the layered structure). In general terms, each conductive element will collect current from a region of the conductive surface that extends along both sides of the conductive element. The current extracted by a conductive element is dependent on the size of this region and whether this region is also served by another conductive element. Thus, for example in a region defined between two conductive elements, approximately half of the current will be extracted by each conductive element. On the other hand, in a region defined by a conductive element and an edge of the conductive surface, all of the current will be extracted by the single outermost conductive element. For the same reason, the spacing of the conductive elements will also influence the required current extraction of each conductive element. A larger spacing of the conductive elements, for example, will mean each conductive element serves a greater area so as to increase the amount of current that needs to be extracted by each conductive element.

The provision of at least two conductive elements of different cross-sectional area allows these differences in current extraction to be accommodated. Thus, for example, the larger (second) conductive element may be positioned at a location at which more current is to be extracted. The smaller (first) conductive element may be positioned where less current extraction by the conductive element is required. By arranging the conductive elements in this manner (i.e. to match the size of a conductive element to current extraction requirements), power losses may be minimised while also minimising shading by the conductive elements. That is, the provision of conductive elements of different cross-sectional area may facilitate arrangement of the conductive elements in a manner that optimises the optoelectronic properties of the electrode assembly.

For the avoidance of doubt, the term “cross-sectional area” is used to describe the area of a section of a conductive element in a plane that is perpendicular to the (longitudinal) extension of that conductive element.

The term “on”, as used herein, for example in the phrase “on a surface”, is intended to encompass both direct and indirect arrangement on an element such as e.g. a layer, film, or region. Thus, the phrase “on a surface” encompasses arrangements in which one or more intervening layers are provided or, alternatively, in which no intervening layers are provided. In contrast, when an element is referred to as being “directly on” another element (e.g. “directly on the surface”), there are no intervening elements present. Accordingly, in the first aspect, the electrode assembly may be arranged directly or indirectly on the conductive surface.

The terms “longitudinally” (defined by the direction of the conductive elements) and “laterally” refer to directions that are substantially perpendicular to one another.

The terms ‘conductive’ and ‘insulating’ as used herein, are expressly intended to mean electrically conductive and electrically insulating, respectively. The meaning of these terms will be particularly apparent in view of the technical context of the invention, being that of photovoltaic solar cell devices.

Optional features of the first aspect will now be set out. These are applicable singly or in any combination with any aspect.

As noted above, the plurality of conductive elements may be configured such that the second conductive element extracts more current than the first conductive element from the conductive surface of the layered structure. For example, the second conductive element may be an outermost conductive element of the plurality of conductive elements. The plurality of conductive elements may comprise two outermost conductive elements and a plurality of intermediate conductive elements disposed between the two outermost conductive elements. In some embodiments, the second conductive element may be an intermediate conductive element.

As discussed above, the outermost conductive elements of the plurality of conductive elements may in some cases serve (i.e. extract current from) a greater area than the intermediate conductive elements (i.e. where the outermost conductive elements are spaced from the edge of the conductive surface by a distance that is greater than half the spacing between the plurality of conductive elements). That is because, all of the current extracted in a region between the outermost conductive element and an adjacent edge of the conductive surface must pass through the outermost conductive element (whereas in a region between two adjacent conductive elements, only half of the current passes through each conductive element). Increasing the cross-sectional area of the outermost conductive element means that it can better accommodate this greater current and this may help to minimise power losses (that could otherwise result from under-sizing the conductive element).

The second conductive element may have a greater effective served area than the first conductive element. For an intermediate conductive element, the effective served area may be determined by summing half of a first area with half of a second area. The first area may be defined as the area between the intermediate conductive element and a first adjacent conductive element, and the second area may be defined as the area between the intermediate conductive element and a second adjacent conductive element. For an outermost conductive element, the effective served area may be determined by summing half of a third area with a fourth area. The third area may be defined as the area between the outermost conductive element and an adjacent conductive element, and the fourth area may be defined as the area between the outermost conductive element and an adjacent edge of the layered structure.

For the avoidance of doubt, the first, second, third and fourth areas are areas of the surface of the layered structure upon which the electrode assembly is arranged (i.e. the conductive surface). Further, a reference to an area that is defined at least partly by a wire (e.g. between two wires, or between a wire and an edge), that reference is to an area that extends to a central axis of the wire.

For the avoidance of doubt, the term “adjacent” as used herein does not mean “directly adjacent to” or “in contact with”. For example, the term “adjacent conductive element” is used herein to describe the closest conductive element (or one of two closest conductive elements) in a lateral direction. Similarly, the term “adjacent edge” is used herein to describe the closest longitudinally extending edge (i.e. closest in a lateral direction).

A further benefit of providing a larger outermost conductive element is that this may allow the conductive element to be spaced a greater distance from the edge of the layered structure (e.g. edge of the conductive surface), while still being able to accommodate the increased current collection from the larger region it serves (due to the increased spacing). By providing this increased spacing from the edge of the layered structure (e.g. conductive surface), there is a larger region at the edge of the layered structure (e.g. conductive surface) that is free of conductive elements. This larger conductive element-free region can provide better adhesion between e.g. a film (when present) and the solar cell (because the increased sized of this region provides a larger area of contact between the film and the solar cell). Thus, when present, a film (and consequently the conductive elements) may be more securely retained on the solar cell.

More generally, the use of a larger conductive element (regardless of whether it is the outermost wire) can provide a larger contact area between the conductive element and the conductive surface so as to provide improved contact (and better adhesion) between the conductive element and the conductive surface.

The first conductive element may be an intermediate conductive element. Alternatively, the first conductive element may be an outermost conductive element. This may be desirable, for example, where the outermost conductive elements are disposed at or close to the edge of the conductive surface so as to serve a smaller area that the intermediate conductive elements. The first conductive element may be adjacent the second conductive element.

The plurality of conductive elements may comprise a third conductive element, which may have a third cross-sectional area. The third cross-sectional area may be larger than the first cross-sectional area. The third cross-sectional area may be the same as the second cross-sectional area. Thus, the second and third conductive elements may have the same cross-sectional area. The third conductive element may be an outermost conductive element of the plurality of conductive elements (i.e. the second and third conductive elements may define the two outermost conductive elements of the plurality of conductive elements).

Accordingly, the two outermost conductive elements (e.g. the second and third conductive elements) of the plurality of conductive elements may each have a larger cross-sectional area than at least one intermediate conductive element (e.g. the first conductive element). The two outermost conductive elements of the plurality of conductive elements may each have a larger cross-sectional area than a plurality of the intermediate conductive elements. In some embodiments, the two outermost conductive elements of the plurality of conductive elements may each have a larger cross-sectional area than that of each of the intermediate conductive elements (i.e. the outermost conductive elements may be larger than all of the intermediate conductive elements).

In some embodiments, all (or substantially all) of the intermediate conductive elements may have the same cross-sectional area (e.g. the first cross-sectional area).

The plurality of conductive elements may be evenly spaced (i.e. equi-spaced). That is, there may be a consistent spacing between each adjacent pair of conductive elements in the plurality of conductive elements. The plurality of conductive elements may alternatively be unevenly spaced. That is, the lateral spacing between at least one pair of adjacent conductive elements may be greater than the lateral spacing between another pair of adjacent conductive elements. Where a first pair of conductive elements has a greater spacing therebetween than a second pair of conductive elements (of the plurality of conductive elements), the first pair of conductive elements may include the second conductive element and the second pair of conductive elements may include the first conductive element.

The plurality of conductive elements may be substantially parallel to one another.

The shape (in addition to cross-sectional area, as discussed above) of the conductive elements may be chosen to optimise the optoelectronic properties of the electrode assembly, i.e. via their electric current collection and shading characteristics.

Each conductive element may have a circular cross-sectional shape i.e. transverse to its axial length. Alternatively, each conductive element may have different transverse cross-sectional shape, including a rectangular or triangular shape, for example. Alternatively, each conductive element may have a transverse cross-sectional shape that is elliptical, obround (i.e. racecourse shaped) or irregular.

Each conductive element may comprise a conductive metal, or metal alloy. Each of the conductive elements may be coated with an alloy coating which comprises an alloy having a low melting point i.e. a melting point lower than the melting point of the conductive metal/metal alloy forming the core of the conductive element. Each conductive element may be completely coated in the alloy coating, or at least partially coated on a side, or sides, which faces the layered structure of the solar cell (when arranged thereon).

Each conductive element may have a substantially constant cross-sectional area along its length. Each conductive element may have a substantially constant cross-sectional shape along its length.

The first conductive element and/or each intermediate conductive element may have a first diameter. The first diameter may be between 200 μm and 300 μm, or e.g. between 225 μm and 275 μm, or about 250 μm. The first cross-sectional area may be between 0.03 $mm^2$ and 0.07 $mm^2$, or e.g. between 0.04 $mm^2$ and 0.06 $mm^2$, or about 0.05 $mm^2$.

The second conductive element and/or third conductive element may have a second diameter. The second diameter may be between 250 μm and 350 μm, or e.g. between 275 μm and 325 μm, or about 300 μm. The second cross-sectional area may be between 0.05 $mm^2$ and 0.10 $mm^2$, or e.g. between 0.06 $mm^2$ and 0.08 $mm^2$, or about 0.07 $mm^2$.

The second diameter may be between 30 μm and 70 μm larger than the first diameter. The second diameter may be about 50 μm larger than the first diameter.

The second cross-sectional area may be between 0.01 $mm^2$ and 0.03 $mm^2$ larger than the first cross-sectional area. The second cross-sectional area may be about 0.02 $mm^2$ larger than the first cross-sectional area.

The second cross-sectional area may be between 30% and 60% larger than the first cross-sectional area. The second cross-sectional area may be about 45% larger than the first cross-sectional area.

A first distance may be defined between two adjacent conductive elements of the plurality of conductive elements (e.g. the first conductive element and an adjacent conductive element). When the conductive elements are evenly spaced, the first distance may represent the (even) spacing between each of the conductive elements (i.e. each conductive element may be spaced from adjacent conductive elements by the first distance).

The first distance may be between 8 mm and 10 mm or between 8.5 mm and 10 mm, or between 9 mm and 9.5 mm, or about 9.3 mm.

For the avoidance of doubt, references to distances and or spacing between conductive elements and/or edges herein are to be taken as lateral distances/spacing (i.e. taken in a direction perpendicular to the axial extension of the conductive elements). Further, (lateral) distances involving one or more conductive elements should be taken from a central axis of the conductive element. As an example, reference to a distance between two adjacent conductive elements is the distance between the central axis of one conductive element and the central axis of the other adjacent conductive element. As a second example, reference to a distance between a conductive element and an edge (of a film or layered structure) is a reference to the lateral distance between the central axis of the conductive element and the edge. As may be appreciated, in this second example, the central axis of the conductive element may be spaced from (e.g. above) the surface of the component (e.g. film or layered structure) of which the edge forms a part of. In such cases, emphasised that a reference to such a distance is a reference to the lateral component of the distance between the central axis and the edge (i.e. the distance should be taken parallel to the surface).

A distance between an outermost conductive element of the plurality of conductive elements and an adjacent edge of the layered structure (e.g. edge of the conductive surface) may be equal to or larger than a distance between two adjacent conductive elements of the plurality of conductive elements. In other words, the electrode assembly may be arranged on the conductive surface such that a second (lateral) distance is defined between an outermost conductive element (e.g. the second conductive element) of the plurality of conductive elements and an adjacent (longitudinal) edge of the conductive surface of the layered structure upon which the electrode assembly is arranged. The second distance may be equal to or longer than the first distance. That is, the outermost conductive element may be spaced from an adjacent edge of the layered structure by a greater distance than that between two adjacent conductive elements of the plurality of conductive elements.

The first distance may be defined between the outermost conductive element (e.g. the second conductive element) partly defining the second distance and the conductive element (e.g. the first conductive element) adjacent to this outermost conductive element.

As already discussed above, maximising the distance of the conductive elements from the edge of the solar cell assembly can be beneficial in that it provides a larger conductive element-free area for adhesion with a means for securing the conductive elements to the solar cell assembly (such as a film). The larger outermost conductive element may permit such distancing by ensuring that there is sufficient capacity to extract charge (with minimal power loss) from the larger area that results from such distancing.

In other embodiments, the second distance maybe less than the first distance (e.g. may be approximately half of the first distance).

A third (lateral) distance may be defined between the other of the two outermost conductive elements (e.g. the third conductive element) and an adjacent edge of the layered structure (e.g. adjacent edge of the conductive surface). The third distance may be the same as the second distance. In this respect, the plurality of conductive elements may be arranged on the layered structure such that the spacing between opposite (longitudinally extending) edges of the layered structure and adjacent outermost conductive elements is greater than the spacing between the conductive elements themselves.

The second and/or the third distance may be between 10 mm and 13 mm, or between 11 mm and 12 mm, or between 11 mm and 11.5 mm, or about 11.25 mm.

The electrode assembly may comprise an insulating optically transparent film. The film may overlie the conductive elements (i.e. the conductive elements may be provided between the film and the conductive surface). The film (also referred to as a foil) may provide means for maintaining the conductive elements in their spaced arrangement during mounting onto the conductive surface. The film may be configured to retain the electrode assembly on the surface of the layered structure (thereby maintaining ohmic contact between the conductive elements and the conductive surface). The electrode assembly may be referred to as a foil (or film) and wire assembly when it includes such a film (and when the conductive elements are in the form of wires).

A distance between an outermost conductive element of the plurality of conductive elements and an adjacent edge of the film may be equal to or larger than a distance between two adjacent conductive elements of the plurality of conductive elements. That is, the plurality of conductive elements may be arranged such that a fourth (lateral) distance, that is equal to or larger than the first distance, is defined between an outermost conductive element (e.g. the second conductive element) of the plurality of conductive elements and an adjacent (longitudinal) edge of the film.

A fifth (lateral) distance that is equal to or larger than the first distance may be defined between the other of the two outermost conductive elements (e.g. the third conductive element) and an adjacent edge of the film. The fifth distance may be the same as the fourth distance.

In this respect, the plurality of conductive elements may be arranged such that the spacing between opposing longitudinal edges of the film and adjacent outermost conductive elements is greater than the spacing between the conductive elements.

The fourth and/or the fifth distance may be between 10 mm and 13 mm, or between 11 mm and 12 mm, or between 11 mm and 11.5 mm, or about 11.25 mm.

Each of the first, second, third, fourth and fifth distances may be taken along the same laterally extending axis.

As already discussed above, maximising the distance of the conductive elements from the edge of the film can be beneficial in that it provides a larger conductive element-free area for adhesion of the edge of the film with a solar cell (and this may be achieved by varying the sizes of the conductive elements).

As set forth above, the film may be configured to retain the conductive elements on the layered structure of a solar cell. The conductive elements may be attached (e.g. adhered) to the film. The conductive elements may be partially embedded in the film such that a surface of each conductive element protrudes from the surface of the film. Alternatively, the conductive elements may be completely embedded in the film.

Each of the conductive elements may comprise an elongate form, such as a wire or wire portion (although in other embodiments the conductive elements may be e.g. busbars). Each conductive element may be continuous (i.e. without breaks) and may extend across a substantial portion of (e.g. substantially fully across) the film. Each conductive element may extend substantially from one edge of the film to an opposite edge of the film without discontinuities. Each conductive element may extend beyond at least one of the edges of the film. In some embodiments, references to conductive elements herein may be references to only portions of those conductive elements that are arranged on the surface of the layered structure.

The film may be rectangular. The film may have a long dimension and a short dimension. The conductive elements may extend in the direction of the short dimension (i.e. the longitudinal direction may be in the direction of the short dimension). In such embodiments, the lateral direction may therefore be in the direction of the long dimension. Alternatively, the conductive elements may extend in the direction of the long direction, and the lateral direction may be in the direction of the short dimension.

The film may comprise a polymer material having high ductility, good insulating characteristics, optical transparency and thermal stability, resistance to shrinkage. Exemplary polymer materials may comprise acetate, epoxy resin, fluororesin, polyamide resin, polysulfone, rayon, polyolefin, plastilene, rayonext, polyethylene terephthalate (PET), polyvinyl fluoride film and modified ethylene tetrafluoroethylene, etc.

The surface of the film (i.e. facing the conductive elements) may be coated with a transparent seal layer (e.g. an adhesive layer). The seal layer may be configured to be in a non-adhering state at room temperature and may be configured to enter an adhering state when heated (i.e. to a temperature above room temperature). Accordingly, during fabrication of the solar cell, the film may be heated so that the seal layer softens to enable adherence of the film to the conductive elements due to an application of force. In this way, the conductive elements may be at least partially embedded in the seal layer. Additionally or alternatively, the film (e.g. a portion or surface of the film configured to contact the solar cell) may be configured to be in a non-adhering state at room temperature and may be configured to enter an adhering state when heated (i.e. to a temperature above room temperature). Accordingly, during fabrication of the solar cell, the film may be heated and soften to enable adherence of the film to the conductive elements due to an application of force. In this way, the conductive elements may be at least partially embedded in the film. In this embodiment, no seal layer may be present.

The conductive surface may comprise a plurality of finger electrodes (e.g. conductive elements/members). Each finger electrode may be elongate and may extend in a substantially lateral direction. The conductive elements (of the electrode assembly) may extend across the plurality of finger electrodes in a longitudinal direction. In this respect, the finger electrodes may be substantially perpendicular to the conductive elements.

The finger electrodes may comprise a printed conductive material. The printed conductive material may enable the formation of fine (i.e. narrow width and small depth) finger electrodes on the surface of the layered structure.

The finger electrodes may be distributed substantially evenly across the conductive surface. Thus, for example, a region between an outermost conductive element and an edge of the conductive surface may have the same number of finger electrodes as a region between two adjacent conductive elements. In other words, the conductive surface may be free of redundancy lines (extending from one or both of the opposed longitudinal edges of the conductive surface that are parallel to the conductive elements).

The presence of one or more larger outermost conductive elements may facilitate the provision of such an arrangement. Redundancy lines are typically provided at the edges of a solar cell to reduce losses that occur because the regions at the edges are only served by one conductive element each. Providing larger outermost conductive elements, with lower resistance, can mean that in some cases the redundancy lines can be removed without detriment to the efficiency of the solar cell assembly. This is because the lower power losses of the larger outermost conductive elements and the higher current in the outermost regions (resulting from reduced shading that would otherwise be caused by the redundancy lines) can counteract any negative effect of the removal of the redundancy lines.

The layered structure may comprise a front surface (e.g. frontmost surface) upon which light is incident in use, and a rear surface (e.g. rearmost surface) opposite the front surface.

The conductive surface may be a front surface (light incident surface) of the layered structure. Thus, the electrode assembly may be arranged on the front surface of the layered structure (i.e. on the finger electrodes of the conductive surface), and the conductive elements may extend across the front surface of the layered structure (i.e. across the finger electrodes). Such an electrode assembly may be referred to as a front electrode assembly.

In other embodiments, the conductive surface may be a rear surface of the layered structure. Thus, the electrode assembly may be arranged on the rear surface of the layered structure, and the conductive elements may extend across the rear surface of the layered structure (i.e. on the finger electrodes of the conductive surface). Such an electrode assembly may be referred to as a rear electrode assembly.

The solar cell assembly may comprise both front and rear electrode assemblies (and the layered structure may comprise both front and rear conductive surfaces).

The layered structure may comprise multiple layers including the photovoltaic element. The photovoltaic element may comprise a semiconductor material. Thus, the photovoltaic element may be a semiconductor substrate. The semiconductor substrate may be formed of crystalline silicon (e.g. a monocrystalline silicon wafer). The substrate may be configured with a first conductivity type (e.g. n-type) and the layered structure may comprise a collector layer which is configured with a second conductivity type (e.g. a p-type) that is opposite the first conductivity type, and thus forms a p-n junction with the substrate. According to such an arrangement, the collector layer may define a minority charge carrier collector layer (e.g. a hole-collector layer) of the solar cell.

During operation of the solar cell, a plurality of electron-hole pairs are produced by light incident on the substrate. When the substrate is n-type and the minority charge carrier collector layer is p-type (e.g. a hole-collector layer), the separated holes and electrons move to the p-type hole-collector layer and the n-type substrate, respectively. Accordingly, the holes operate as majority charge carriers in the p-type hole-collector layer, and the electrons operate as majority charge carriers in the n-type substrate.

According to an alternative arrangement, the substrate may be p-type and the minority charge carrier collector layer may be n-type (e.g. an electron-collector layer), thus forming a p-n junction with the substrate. In this instance, the separated electrons and holes move to the n-type electron-collector layer and the p-type substrate, respectively.

The collector layer may define a majority charge carrier collector layer configured with the first conductivity type (e.g. n-type), which is the same as that of the substrate. For example, both the substrate and the majority charge carrier collector layer may be n-type, such that the majority charge carrier collector layer defines an electron-collector layer. As such, the majority charge carrier collector layer may be configured to selectively screen, or extract, charge carriers from the substrate. Accordingly, when the solar cell is in use, the electrons produced by light incident on the substrate may be collected in the electron-collector layer, wherein they operate as majority charge carriers.

The collector layer may be arranged on a first surface of the substrate. The layered structure of the solar cell may further comprise a second collector layer (e.g. a back-field layer), arranged on a second surface of the substrate, opposite the first surface. The first and second surfaces may define the front and back (or rear) surfaces of the substrate, respectively. The layered structure of the solar cell may further comprise a passivation layer arranged between the substrate and the respective first and second collector layers.

According to an exemplary arrangement, the substrate may be formed from an n-type monocrystalline silicon wafer, which exhibits longer lifetime characteristics compared to a p-type monocrystalline silicon wafer. The front collector layer may comprise an amorphous material (e.g. amorphous silicon) which is at least partially doped so as to be n-type. The back collector layer may comprise an amorphous material (e.g. amorphous silicon) which is at least partially doped so as to be p-type. In other embodiments, the back collector layer may be at least partially doped so as to be n-type and the front collector layer may be at least partially doped so as to be p-type.

Such an arrangement may contribute towards the formation of a heterojunction technology (HJT) type solar cell, which is so defined because it combines two different materials to create a charge separating p-n junction. Alternatively, the solar cell may comprise a multi-junction (e.g. tandem) solar cell, which is so defined because it comprises two or more charge separating junctions and two or more charge-generating photon absorbing layers. Of course, the layered structure may take others forms (e.g. the solar cell assembly may not be a heterojunction solar cell).

The electrode assembly may be arranged such that the collector layer is interposed between the electrode assembly and the substrate.

When the collector layer is arranged on a back (e.g. backmost) surface of the substrate, the electrode assembly may be arranged on a back surface of the layered structure, to define a back electrode of the solar cell. When the collector layer is arranged on a front (e.g. frontmost) surface of the substrate, the electrode assembly may be arranged on a front surface of the layered structure, to define a front electrode of the solar cell. The solar cell may comprise a front electrode assembly arranged on the front surface of the front layered structure and a back electrode assembly arranged on the back surface of the back layered structure.

The semiconductor substrate may comprise crystalline silicon (c-Si). When the semiconductor substrate is an n-type semiconductor, the semiconductor material may be configured to contain impurities of a group V element such as phosphor (P), arsenic (As), and antimony (Sb). When the semiconductor material is a p-type semiconductor material, it may contain impurities of a group III element such as boron (B), gallium (Ga), and indium (In). Alternatively, the semiconductor material may be formed of materials other than silicon.

A surface of the layered structure e.g. the front surface may be textured to form an uneven surface or a surface having uneven characteristics. In this instance, an amount of light incident on the layered structure increases because of the textured surface of the layered structure, and thus the efficiency of the solar cell assembly may be improved.

The layered structure may further comprise an anti-reflection layer, or coating, arranged at the front and/or rear surfaces of the layered structure. The, or each, anti-reflection layer may have a single-layered structure or a multi-layered structure. The anti-reflection layer may be formed of silicon nitride (SiNx) and/or silicon oxide (SiOx). Alternatively, the anti-reflection layer may be formed of a transparent conductive oxide (TCO), such as indium tin oxide (ITO), which has been textured to provide an anti-reflective surface. The anti-reflection layer may advantageously reduce the reflectance of light incident on the solar cell assembly and increase selectivity of a predetermined wavelength band, thereby increasing the efficiency of the solar cell assembly.

In a second aspect there is provided a solar module comprising a plurality of solar cell assemblies, each according to the first aspect. The solar cell assemblies may be electrically coupled to one another.

The plurality of solar cell assemblies may comprise first and second solar cell assemblies, the conductive wires of the first solar cell assembly being electrically coupled to the conductive elements of the second solar cell assembly. Accordingly, the plurality of conductive elements may form an electrical connection between two or more solar cell assemblies in the solar cell module.

The plurality of conductive elements may comprise pairs of electrically coupled conductive elements, each pair comprising a first conductive element forming part of the first solar cell assembly and a second conductive element forming part of the second solar cell assembly. The first and second conductive elements may be electrically coupled together by a third conductive element (e.g. a copper ribbon) to allow current to flow between the first and second conductive elements. The third conductive element may be substantially parallel or substantially perpendicular to the first and second conducting elements.

The first, second and third conductive elements may be integrally formed to form a single integrally formed element (e.g. wire). Configuring the conductive elements in this way removes the need to provide separate connections (such as copper ribbons) between neighbouring solar cells, which thereby reduces the number and complexity of manufacturing steps required to fabricate the solar cell assembly.

Alternatively, the first and second conductive element (and third conductive element when present) may be separately formed but electrically coupled together.

The first conductive element may contact a front conductive surface of the layered structure of the first solar cell assembly, and the second conductive element may contact a rear conductive surface of the second solar cell assembly. The third conductive element, when present, may thus extend from the front surface of the layered structure of the first solar cell assembly to the rear surface of the layered structure of the second solar cell assembly.

As discussed above, the electrode assemblies of each solar cell assembly comprise films. The conductive elements are received between these films and respective conductive surfaces of corresponding solar assemblies. The films of one solar cell assembly may be separate from the films of another solar cell assembly. Thus, each first conductive element may be received between a first film and the front surface of the layered structure of the first solar cell assembly, and each second conductive element may be received between a second film and the rear surface of the layered structure of the second solar cell assembly. Each third conductive element may extend between the first and second films (i.e. may not be attached/received on either of the first and second films).

As may be appreciated, the second solar cell assembly may be coupled to a third solar cell assembly in a similar manner (i.e. conductive elements extending from the front conductive surface of a layered structure of the second solar cell assembly to the rear conductive surface of a layered structure of the third solar cell assembly). In this way, a row or string of coupled solar cell assemblies may be formed.

In a third aspect, there is provided an electrode assembly for a solar cell, the electrode assembly comprising:

- an insulating optically transparent film; and
- a plurality of longitudinally extending, laterally spaced conductive elements arranged side by side on a surface of the film, the plurality of conductive elements comprising a first conductive element having a first cross-sectional area and a second conductive element having a second cross-sectional area that is larger than the first cross-sectional area.

The electrode assembly of the third aspect may be the same as the electrode assembly described above with respect to the first aspect (and may include one or more of the optional features of the first aspect). Thus, the film may be as described above with respect to the first aspect and, likewise, the plurality of conductive elements (including their arrangement) may be as described above with respect to the first aspect.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which.

DETAILED DESCRIPTION

Aspects and embodiments of the present disclosure will now be discussed with reference to the accompanying figures. Further aspects and embodiments will be apparent to those skilled in the art.

Figure 1A:
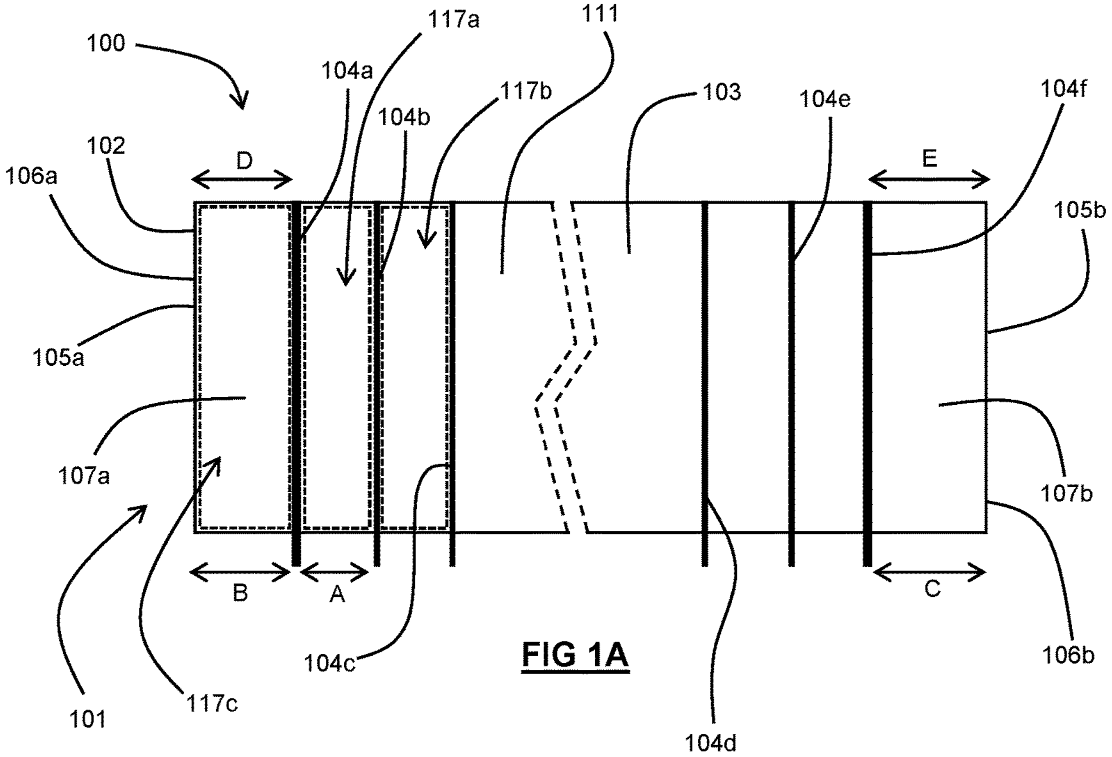
FIG. 1A is a top view of a solar cell.
Figure 1B:
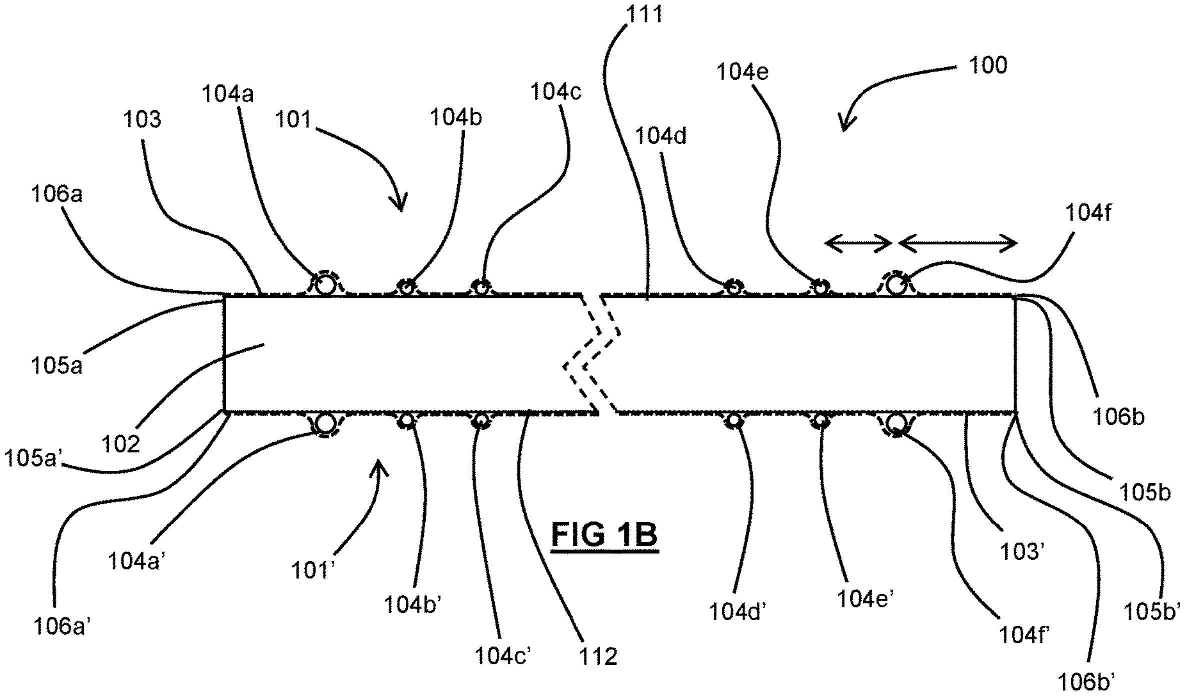
FIG. 1B is a side cross-section view of the solar cell of FIG. 1A.

FIGS. 1A and 1B illustrate a solar cell assembly 100 that includes front 101 and rear 101' electrode assemblies arranged on respective front and rear sides of a layered structure 102 comprising a photovoltaic element (not shown) and front 111 and rear conductive surfaces. For brevity only the front electrode assembly 101 is discussed below, but it should be appreciated that the description equally applies to the rear electrode assembly 101' (and for that reason similar reference numerals have been used to label the rear electrode assembly 101').

The front electrode assembly 101 comprises an electrically insulating optically transparent film 103 and a plurality of laterally spaced conductive elements in the form of wires **104*a*-104*f* arranged side by side on a surface of the film 103. As will be described further below, the electrode assembly 101 is configured for arrangement on front conductive surface 111 of the layered structure 102 of the solar cell assembly 100 for extracting electrical current generated by a photovoltaic element of the layered structure 102 (in response to light incident on the solar cell assembly 100**).

Each of plurality of wires **104*a*-104*f* has a circular cross-sectional shape (as can be seen from FIG. 1B). The plurality of wires 104*a*-104*f* are also evenly spaced, parallel to one another, and extend in a longitudinal direction (the vertical direction in FIG. 1). Although only six wires 104*a*-104*f* are shown, it should be appreciated that a number of (intermediate) wires are omitted from the figures for clarity. A first wire 104*b* of the plurality of wires 104*a*-104*f* has a first cross-sectional area and a second wire 104*a* of the plurality of wires 104*a*-104*f*** has a second cross-sectional area that is larger than the first cross-sectional area (i.e. the second wire

104*a* has a greater diameter than the first wire 104*b*). Again, this is particularly evident from FIG. 1B. The first wire 104*b* has a diameter of 250 μm and the second wire 104*a* has a diameter of 300 μm.

The second wire 104*a*, having the larger cross-sectional area, is one of two outermost wires (the other being a third wire 104*f*) of the plurality of wires 104*a*-104*f*. Although not illustrated, these wires 104*a*-104*f* are arranged on a plurality of finger electrodes of the front conductive surface 111 of the layered structure, which extend perpendicularly with respect to the wires 104*a*-104*f*. The finger electrodes are evenly distributed across the surface and carry current from the layered structure 102 to the wires 104*a*-104*f* for extraction of the current from the solar cell assembly 100 by the wires 104*a*-104*f*. In general, the amount of current extracted by a particular wire of the plurality of wires 104*a*-104*f* is dependent on the proximity of that wire to any adjacent wires and/or adjacent edge of the layered structure 102.

Accordingly, and as should be apparent from the figures, the second wire 104*a* is required to extract more current than the first wire 104*b*. This is because the second wire 104*a* is an outermost wire of the plurality of wires 104*a*-104*f*, which means that all of the current generated in the region between the second wire 104*a* and an adjacent longitudinal edge 105*a* of the layered structure is extracted solely by the second wire 104*a*. This is in contrast to the first wire 104*b*, which is between two other adjacent wires (the second wire 104*a* and a fourth wire 104*c*), such that extraction of current from the regions either side of the first wire 104*b* is shared with the adjacent wires 104*a*, 104*c*.

In particular, the second wire 104*a* has a greater effective served area than the first wire 104*b*. The effective served area for the first wire 104*b* is determined by summing half of a first area 117*a* with half of a second area 117*b*. The first area 117*a* is defined between the first 104*b* and second 104*a* wires, and the second area 117*b* is defined between the first 104*b* and fourth 104*c* wires. The effective served area for the second wire 104*b* is determined by summing half of the first area 117*a* with a third area 117*c*. The third area 117*c* is defined between the second wire 104*a* and the adjacent edge 105*a* of the layered structure 102. Although, for illustrative purposes, the dashed lines indicating the first 117*a*, second 117*b*, and third 117*c* areas are inset from the wires/edges 104*a*, 104*b*, 104*c*, it should be appreciated that these areas 117*a*, 117*b*, 117*c* extend across the entire region between the wires/edges 104*a*, 104*b*, 105*a*.

The greater cross-sectional area of the second wire 104*a* helps to minimise power losses that would otherwise occur if, for example, the second wire was undersized (e.g. had the same cross-sectional area as the first wire 104*b*) with respect to the area that it serves.

As noted above, the plurality of wires 104*a*-104*f* also includes a third wire 104*f*, which is the second outermost wire of the plurality of wires 104*a*-104*f* and is thus disposed at an opposite side of the plurality of wires 104*a*-104*f* to the second wire 104*a*. The third wire 104*f* has the same diameter (300 μm), and thus cross-sectional area, as the second wire 104*a*.

The plurality of wires 104*a*-104*f* includes a plurality of intermediate wires 104*b*-104*e* that are disposed between the outermost wires 104*a*, 104*f*. The first wire 104*b* is one of these intermediate wires 104*b*-104*e*. As is evident from FIG. 1B, each of the intermediate wires 104*b*-104*e* has the same diameter as the first wire 104*b* (such that each intermediate wire 104*b*-104*e* has the first cross-sectional area). Each of the intermediate wires 104*b*-104*e* serves a smaller area (with respect to current extraction) than each of the two outermost wires 104*a*, 104*f*. In this respect, the diameters (and thus cross-sectional areas) of the wires 104*a*-104*f* correspond to the respective areas they are required to serve (and thus the magnitude of the current they are required to extract). This ensures that both power losses (due to under-sizing of wires) and shading (due to over-sizing of wires) are minimised.

In addition to minimising power losses, the larger second 104*a* and third 104*f* wires allow for better adhesion between the film 103 and the surface of the layered structure 102. This will now be described in more detail.

As is evident from the figures, a first distance A representative of a spacing between the wires 104*a*-104*f* is shorter than a second distance B defined between the second wire 104*a* and an adjacent edge 105*a* of the layered structure 102. Likewise, the first distance A is also shorter than a third distance C defined by the third wire 104*f* and the adjacent edge 105*b* of the layered structure 102. In the illustrated embodiment, the film 103 has the same width and length dimensions as the layered structure 102. Thus, the second distance B is the same as a fourth distance D defined between the second wire 104*a* and the adjacent edge 106*a* of the film 103. Similarly, the third distance C is the same as a fifth distance E defined between the third wire 104*f* and the adjacent edge 106*b* of the film 103.

The second, third, fourth and fifth distances can be longer than the first distance because of the larger cross-sectional areas of the second 104*a* and third 104*f* wires (i.e. because these wires 104*a*, 104*f* are capable of greater current extraction). The benefit provided by these longer distances results from the fact that the two spaces between the second 104*a* and third 104*f* wires and their respective adjacent edges 105*a*, 105*b* of the layered structure 102 define regions 107*a*, 107*b* that are free of wires. These wire-free regions provide areas within which the film 103 makes direct contact with the front surface of the layered structure 102 (i.e. uninterrupted by the presence of wires). It is desirable to maximise this direct contact because doing so can increase adhesion between the film 103 and the layered structure 102 (and thus can help to ensure the wires 104*a*-104*f* are securely held on the layered structure 102).

Figure 2:
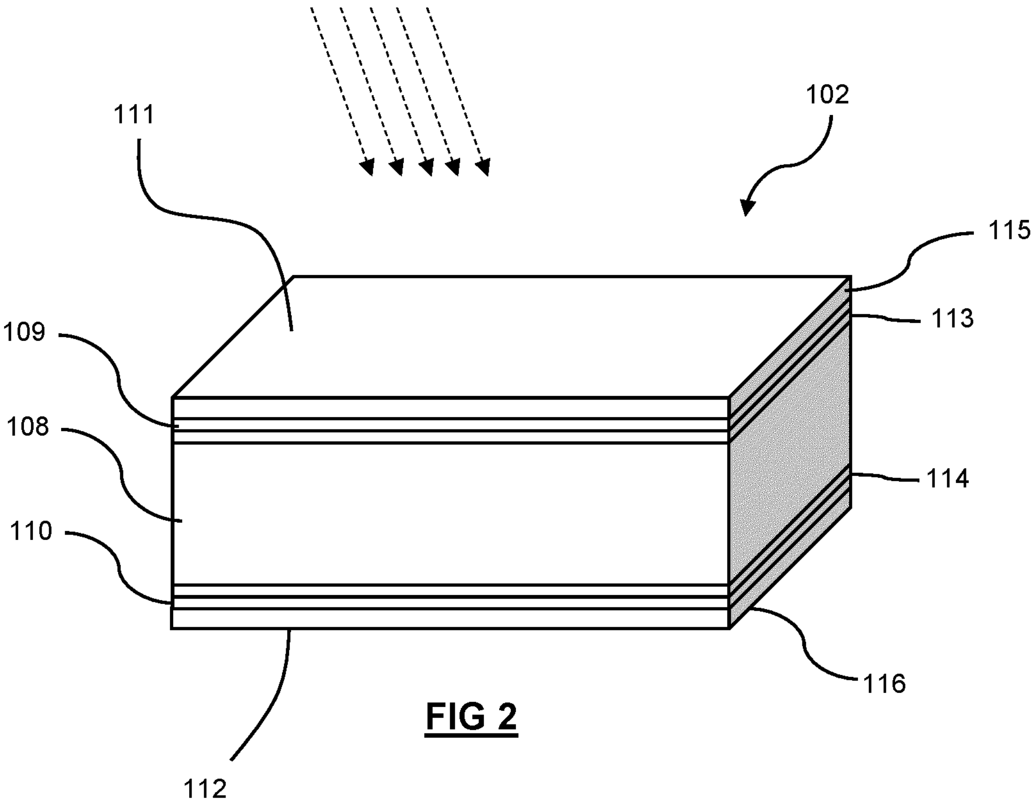
FIG. 2 is a schematic illustrating a layered structure of the solar cell of FIG. 1A.

FIG. 2 is a sectional view of the layered structure 102 of the solar cell assembly 100 described above. In this view, the layered structure 102 is shown isolated from the front 101 and rear 101' electrode assemblies. The layered structure 102 comprises a multi-layer semiconductor assembly including a photovoltaic element in the form of a semiconductor substrate 108 which is sandwiched between a front collector layer 109 and a back collector layer 110. As such, the front collector layer 109 and the back collector layer 110 are arranged at opposite sides of the substrate 108.

The front collector layer 109 is arranged towards the front surface 111 of the layered structure 102 and the back collector layer 110 is arranged towards the rear surface 112. When assembled, the front electrode assembly 101 is electrically connected to the front collector layer 109 and the rear electrode assembly 101' is electrically connected to the back collector layer 110. Such an arrangement defines a heterojunction technology (HJT) type solar cell. In other embodiments, the layered structure may take other forms (e.g. the solar cell assembly may not be in the form of a HJT type solar cell). For example, in some other embodiments, one or more layers may be absent, one or more layers may be combined together, and/or additional layers may be added, provided that the layered structure 102 can continue to perform its function of generating electricity from incident radiation (e.g. light).

The substrate 108 is formed of crystalline silicon (c-Si), which is negatively doped (i.e. an n-type material), with impurities of a group V element, such as phosphor (P), arsenic (As), and antimony (Sb). The front collector layer 109 and the back collector layer 110 are each formed of amorphous silicon (a-Si: H). The amorphous silicon is deposited on the front and rear surfaces of the silicon wafer using PECVD.

The back collector layer 110 comprises a positively doped semiconductor material (i.e. a p-type material), and the front collector layer 109 comprises an n-type material. The p-type material contains impurities of a group III element such as boron (B), gallium (Ga), and indium (In).

In this exemplary arrangement of the layered structure 102, the back collector layer 110 defines an impurity region of the layered structure 102 having an opposite conductive type to that of the substrate 108, and thus forms a p-n junction along with the substrate 108.

The multi-layer semiconductor assembly further comprises first 113 and second 114 intrinsic layers. Both intrinsic layers 113, 114 are formed of intrinsically doped amorphous silicon. The first intrinsic layer 113 is arranged between the front collector layer 109 and the substrate 108 to form a front-side passivation layer. In addition, the second intrinsic layer 114 is arranged between the substrate108 and the back collector layer 110 to form a rear-side passivation layer.

Finally, the front surface 111 of the layered structure 102 is covered with transparent conductive coating 115, which is formed of indium tin oxide (ITO). An upper surface of the ITO layer is textured to provide anti-reflective characteristics. The anti-reflection layer advantageously reduces the reflectance of light incident on the solar cell assembly 100 and increases selectivity of a predetermined wavelength band, thereby increasing the efficiency of the solar cell assembly 100.

The rear surface 112 of the layered structure 102 is also covered with a transparent conductive coating 116 formed of indium tin oxide (ITO). The transparent conductive coatings 115, 116 are configured to increase lateral carrier transport to finger electrodes arranged on the respective surfaces of the layered structure 102. The transparent conductive coatings 115, 116 are particularly advantageous in heterojunction type devices which comprise layers formed of amorphous silicon which exhibit poor carrier mobility.

During operation of the solar cell assembly 100 light is incident upon the layered structure 102, as shown by the arrows at the top of FIG. 2. A plurality of electron-hole pairs are produced through the absorption of the incident photons. The electron-hole pairs are then separated into electrons and holes by a built-in potential difference resulting from the p-n junction. The separated electrons move to the n-type semiconductor in the substrate 108, and the separated holes move to the p-type semiconductor in the back collector layer 110. Accordingly, the electrons become major carriers in the substrate 108, and the holes become major carriers in the back collector layer 110. Each of these majority carriers are extracted from the layered structure 102 by the respective electrode assemblies 101, 101'.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A solar cell assembly comprising:

a layered structure comprising a photovoltaic element and a conductive surface; and an electrode assembly comprising a plurality of longitudinally extending conductive elements arranged side by side, the plurality of conductive elements comprising:

one or more first conductive elements, each of the one or more first conductive elements having a first cross-sectional area defined by one of the one or more first conductive elements;

one or more second conductive elements, each of the one or more second conductive elements laterally spaced from each of the one or more first conductive elements, each of the one or more second conductive elements having a second cross-sectional area defined by one of the one or more second conductive elements, wherein the second cross-sectional area is larger than the first cross-sectional area, the electrode assembly arranged on the conductive surface of the layered structure such that the conductive elements are in ohmic contact with the conductive surface;

wherein each of the one or more first conductive elements is in direct ohmic contact with the conductive surface; and wherein each of the one or more second conductive elements is in direct ohmic contact with the conductive surface.

2. A solar cell assembly according to claim 1, wherein the plurality of conductive elements comprises two outermost conductive elements and a plurality of intermediate conductive elements disposed between the two outermost conductive elements.

3. A solar cell assembly according to claim 2, wherein the second conductive element is an outermost conductive element of the plurality of conductive elements.

4. A solar cell assembly according to claim 2, wherein the first conductive element is an intermediate conductive element.

5. A solar cell assembly according to claim 2, comprising a third conductive element having a third cross-sectional area that is larger than the first cross-sectional area.

6. A solar cell assembly according to claim 5, wherein the third conductive element is an outermost conductive element of the plurality of conductive elements.

7. A solar cell assembly according to claim 2, wherein the two outermost conductive elements each have a cross-sectional area that is larger than that of each of the intermediate conductive elements.

8. A solar cell assembly according to claim 2, wherein a distance between an outermost conductive element of the plurality of conductive elements and an adjacent edge of the layered structure is equal to or larger than a distance between two adjacent conductive elements of the plurality of conductive elements.

9. A solar cell assembly according to claim 1, wherein the plurality of conductive elements are evenly spaced.

10. A solar cell assembly according to claim 1, wherein the first cross-sectional area is between 0.03 $mm^2$ and 0.07 $mm^2$.

11. A solar cell assembly according to claim 1, wherein the second cross-sectional area is between 0.05 $mm^2$ and 0.1 $mm^2$.

12. A solar cell assembly according to claim 1, wherein the second cross-sectional area is between 0.01 $mm^2$ and 0.03 $mm^2$ larger than the first cross-sectional area.

13. A solar cell assembly according to claim 1, wherein each conductive element has a circular transverse cross-sectional shape.

14. A solar cell assembly according to claim 1, wherein the electrode assembly comprises an insulating optically transparent film for retaining the plurality of conductive elements on the conductive surface of the layered structure.

15. A solar cell assembly according to claim 2, wherein the second conductive element has a greater effective served area than the first conductive element, and wherein effective served area is determined for:

an intermediate conductive element by summing half of a first area with half of a second area, the first area defined as the area between the intermediate conductive element and a first adjacent conductive element, and the second area defined as the area between the intermediate conductive element and a second adjacent conductive element; and an outermost conductive element by summing half of a third area with a fourth area, the third area defined as the area between the outermost conductive element and an adjacent conductive element, and the fourth area defined as the area between the outermost conductive element and an adjacent edge of the layered structure.

16. An electrode assembly for a solar cell, the electrode assembly comprising:

an insulating optically transparent film; and a plurality of longitudinally extending conductive elements arranged side by side on a surface of the film, the plurality of conductive elements comprising:

one or more first conductive elements, each of the one or more first conductive element having a first cross-sectional area defined by one of the one or more first conductive elements, and one or more second conductive elements, each of the one or more second conductive elements laterally spaced from each of the one or more first conductive elements, each of the one or more second conductive elements having a second cross-sectional area defined by one of the one or more second conductive elements, wherein the second cross-sectional area larger than the first cross-sectional area;

wherein each of the one or more first conductive elements is configured to be in direct ohmic contact with a conductive surface he solar cell; and wherein each of the one or more second conductive elements is configured to be in direct ohmic c ontact with the conductive surface of the solar cell.

17. An electrode assembly according to claim 16, wherein the plurality of conductive elements comprises two outermost conductive elements and a plurality of intermediate conductive elements disposed between the two outermost conductive elements.

18. An electrode assembly according to claim 17, wherein the second conductive element is an outermost conductive element.

19. An electrode assembly according to claim 17, wherein the first conductive element is an intermediate conductive element.

20. An electrode assembly according to claim 17, wherein a distance between an outermost conductive element of the plurality of conductive elements and an adjacent edge of the film is equal to or larger than a distance between two adjacent conductive elements of the plurality of conductive elements.

21. An electrode assembly according to claim 16, wherein the conductive elements are evenly spaced.

22. An electrode assembly according to claim 16, wherein the second cross-sectional area is between 0.01 $mm^2$ and 0.03 $mm^2$ larger than the first cross-sectional area.

23. An electrode assembly according to claim 16, wherein each conductive element has a circular transverse cross-sectional shape.

* * * * *